(12) United States Patent
Unger et al.

(10) Patent No.: US 12,202,065 B2
(45) Date of Patent: Jan. 21, 2025

(54) DEVICE FOR HEATING AND DETERMINING AN ACTUAL TEMPERATURE OF A BONDING TOOL OF AN ULTRASONIC BONDING DEVICE

(71) Applicant: Hesse GmbH, Paderborn (DE)

(72) Inventors: Andreas Unger, Verl (DE); Michael Broekelmann, Delbrueck (DE); Matthias Hunstig, Paderborn (DE); Hans-Juergen Hesse, Paderborn (DE)

(73) Assignee: Hesse GmbH, Paderborn (DE)

( * ) Notice: Subject to any disclaimer, the term of this patent is extended or adjusted under 35 U.S.C. 154(b) by 139 days.

(21) Appl. No.: 17/691,882

(22) Filed: Mar. 10, 2022

(65) Prior Publication Data
US 2022/0193812 A1    Jun. 23, 2022

Related U.S. Application Data

(63) Continuation of application No. PCT/DE2020/100784, filed on Sep. 8, 2020.

(30) Foreign Application Priority Data

Sep. 11, 2019    (DE) ................. 10 2019 124 335.1

(51) Int. Cl.
*B23K 20/10* (2006.01)
*B23K 20/26* (2006.01)
(Continued)

(52) U.S. Cl.
CPC ........... *B23K 20/10* (2013.01); *B23K 20/106* (2013.01); *B23K 20/26* (2013.01); *B23K 20/004* (2013.01); *B23K 2101/38* (2018.08)

(58) Field of Classification Search
CPC ........... B23K 20/10–106; B23K 20/26; B23K 20/004; B23K 20/005; B23K 20/007;
(Continued)

(56) References Cited

U.S. PATENT DOCUMENTS

| 4,696,101 A | 9/1987 | Vanzetti et al. |
| 5,240,166 A * | 8/1993 | Fontana, Jr. ........... B23K 20/10 228/111.5 |

(Continued)

FOREIGN PATENT DOCUMENTS

| CN | 106102956 A | * 11/2016 | ............. B21D 39/03 |
| CN | 106735967 A | * 5/2017 | ............. B23K 20/10 |

(Continued)

OTHER PUBLICATIONS

International Search Report dated Jan. 26, 2021 in corresponding application PCT/DE2020/100784.

(Continued)

*Primary Examiner* — Kiley S Stoner
(74) *Attorney, Agent, or Firm* — Muncy, Geissler, Olds & Lowe, P.C.

(57) ABSTRACT

A device for heating and determining the actual temperature of a bonding tool of an ultrasonic bonder, comprising the bending tool, which has a first end face, a second end face, a lateral surface, which connects the first end face to the second end face, and an absorption region, comprising a temperature measuring unit for determining an actual temperature of the bonding tool at a temperature measuring point, which is provided on the lateral surface of the bonding tool and preferably at a tip of the bonding tool, and comprising a laser generator, a laser beam being provided with the aid of the laser generator, and the laser beam striking the bonding tool in the absorption region, and the bonding tool being heated as a result of the absorption of the laser beam.

12 Claims, 7 Drawing Sheets

(51) Int. Cl.
*B23K 20/00* (2006.01)
*B23K 101/38* (2006.01)

(58) Field of Classification Search
CPC ............ B23K 2101/38; B23K 2103/10; B23K 2103/12; B23K 1/06; B23K 65/645; H01L 2224/78252; H01L 2224/78263
USPC .... 228/1.1, 110.1, 180.5, 4.5, 904, 102–105, 228/8–12; 156/73.1–73.6, 580.1–580.2
See application file for complete search history.

(56) References Cited

U.S. PATENT DOCUMENTS

| | | | | |
|---|---|---|---|---|
| 5,298,715 | A * | 3/1994 | Chalco | B23K 1/0056 |
| | | | | 219/121.64 |
| 6,344,625 | B1 | 2/2002 | Kim et al. | |
| 6,676,778 | B1 * | 1/2004 | Tuchiya | G11B 5/4826 |
| | | | | 360/234.6 |
| 7,980,444 | B2 * | 7/2011 | Ebihara | H05K 13/046 |
| | | | | 228/49.5 |
| 2010/0025453 | A1 | 2/2010 | Geissler et al. | |
| 2013/0270230 | A1 * | 10/2013 | Cheung | H01L 24/75 |
| | | | | 228/180.21 |
| 2020/0282488 | A1 | 9/2020 | Hesse et al. | |

FOREIGN PATENT DOCUMENTS

| | | | | |
|---|---|---|---|---|
| DE | 102017127251 | A1 | 5/2019 | |
| DE | 102017129546 | A1 | 6/2019 | |
| DE | 102019124332 | A1 * | 3/2021 | ............... B06B 1/02 |
| DE | 102019124335 | A1 * | 3/2021 | ........... B23K 20/004 |
| EP | 0367705 | A2 * | 5/1990 | |
| EP | 0947281 | A2 * | 10/1999 | |
| JP | H0474445 | A | 3/1992 | |
| JP | 2002118152 | A | 4/2002 | |

OTHER PUBLICATIONS

International Preliminary Report on Patentability dated Mar. 24, 2022 in corresponding application PCT/DE2020/100784.

* cited by examiner

DEVICE FOR HEATING AND DETERMINING AN ACTUAL TEMPERATURE OF A BONDING TOOL OF AN ULTRASONIC BONDING DEVICE

This nonprovisional application is a continuation of International Application No. PCT/DE2020/100784, which was filed on Sep. 8, 2020, and which claims priority to German Patent Application No. 10 2019 124 335.1, which was filed in Germany on Sep. 11, 2019, and which are both herein incorporated by reference.

BACKGROUND OF THE INVENTION

Field of the Invention

The present invention relates to a device for heating and determining an actual temperature of a bonding tool of an ultrasonic bonder.

Description of the Background Art

To further shorten the process times during ultrasonic bonding and to be able to process difficult-to-bond materials, it is known to supply thermal energy in addition to the mechanical pressure force and the ultrasonic energy when establishing the bonding connection. For example, it is known to heat a substrate with the aid of a suitable heating system. It is also known to heat a joining element, for example an aluminum or copper wire, during ultrasonic wire bonding, using a laser beam. It is furthermore known to heat the bonding tool itself.

Bonding tools are known from DE 10 2017 127 251 A1, which corresponds to US 2020/0282488, which is incorporated herein by reference, as well as DE 10 2017 129 546 A1 of the applicant, which may be heated in the region of the tip with the aid of a laser beam. For this purpose, the bonding tools provide a longitudinal recess formed in the manner of a blind hole, which extends along the shank up to the region of the tool tip and which is used to guide the laser beam or to accommodate a waveguide, which guides the laser beam. As a result, the laser beam is coupled into the bonding tool at the end face and is guided in the interior of the bonding tool, along the shank to the tip of the bonding tool.

SUMMARY OF THE INVENTION

It is therefore an object of the present invention to provide a device, with the aid of which the bonding tool may be heated, and with the aid of which an actual temperature of the bonding tool may furthermore be measured.

The device for heating and determining the actual temperature of the bonding tool of an ultrasonic bonder thus comprises: a bonding tool, which has a first end face, a second end face, a lateral surface, which connects the first end face and the second end face, and an absorption region, which is preferably provided on the lateral service of the bonding tool; a temperature measuring unit for determining the actual temperature of the bonding tool at a temperature measuring point, which is provided on the lateral surface of the bonding tool and preferably at a tip of the bonding tool; and a laser generator, a laser beam being provided with the aid of the laser generator, and the laser beam striking the bonding tool in the absorption region, and the bonding tool being heated as a result of the absorption of the laser beam.

An advantage of the invention is that the laser-supported ultrasonic bonding process may be influenced and monitored in a very targeted manner by means of the temperature measurement. In particular, an imminent damage to the bonding tool or the joining partner (joining element, substrate or function element) as a result of an impermissible heating may be detected in time. In addition, a constantly high quality and reproducibility of the bonding results may be achieved with the aid of the bonding device according to the invention, particularly during normal operation.

The temperature measuring unit may provide, for example, a tactile sensor fixed to the bonding tool itself for the contact-based temperature measurement. For example, a resistance thermometer, in particular a Pt100, or a thermocouple, in particular a K-type thermocouple, may be provided on the bonding tool as the temperature sensor. The temperature sensor may, for example, be applied or glued to the lateral surface of the bonding tool, or it may be glued or cast into a sensor recess of the bonding tool.

For example, the temperature measuring point may be situated in the absorption region, which is formed on the bonding tool. Alternatively, the temperature measuring point and the absorption region may be implemented in separate locations on the bonding tool.

The laser beam may be guided via a blind hole-like longitudinal recess, which extends lengthwise in the bonding tool from the second end face to the tool tip. For example, the laser beam may be aimed onto the boding tool on the lateral surface, i.e., from the outside.

In particular, the bonding tool may be heated with the aid of the laser beam in the region of the tip of the bonding tool. The joining element, for example the bonding wire, may be fixed to the tip of the bonding tool. By heating the tip of the bonding tool in a targeted manner with the aid of the laser beam, a favorable heat transfer results from the bonding tool to the joining element and also from the joining element to a substrate or a function element when establishing the integral connection. The substrate or the function element provides a contact surface, with the aid of which the joining element is to be electrically conductively connected.

The bonding tool can have a particularly high absorption capacity in the absorption region. In particular, the absorption capacity may be higher in the absorption region that outside this region. For example, the bonding tool may have a coating in the absorption region, which is formed from a particularly absorptive material—with regard to a wavelength of the laser beam—in particular, titanium.

For example, local microstructures may be provided on the surface of the bonding tool to improve the absorption capacity.

The temperature of the bonding tool may be determined in a contactless manner. During the contactless temperature measurement, at least one part of the temperature measuring unit may be advantageously provided outside the bonding head. The mass moved with the aid of the bonding tool is thus small, and the ultrasonic bonder is characterized by good dynamics.

A recess can be provided on the lateral surface of the bonding tool, which defines the absorption region. In addition, the device according to the invention provides a waveguide, which has a free head end aimed at the temperature measuring point. The head end of the waveguide is assigned to the recess at a distance, in such a way that at least one part of a thermal radiation emitted by the bonding tool as a result of the heating of the bonding tool by the laser beam strikes the head end of the waveguide and is coupled into the waveguide, the temperature measuring unit interacting with the waveguide in such a way that at least one part of the thermal radiation coupled into the waveguide is conducted to the temperature measuring unit. A part of the thermal radiation emitted by the bonding tool may be advantageously coupled into the waveguide and supplied to the temperature measuring unit. The temperature measuring unit may thus be provided on the bonding tool at a comparatively great spatial distance. A fixed spatial assignment or a defined relative position of the bonding tool and the temperature measuring unit is not necessary. Unlike in the conventional pyrometer arrangement, it is also not necessary to provide a free path between the bonding tool and the temperature measuring unit.

For example, the bonding tool may be fixed to a positionable bonding head of the ultrasonic bonder. A clamping of the bonding tool usually takes place in the region of the second end face. Relative to the bonding tool, the free head end of the waveguide is also positioned at the bonding head. A fixed position assignment thus results with regard to the free head end of the waveguide and the bonding tool. The temperature measuring unit, however, may be provided in a fixed location on the ultrasonic bonder. In particular, the temperature measuring unit does not have to be installed in the bonding head and may be carried along during the positioning of the bonding head, with the result that the dynamics of the bonding head are retained despite the additional measurement infrastructure.

The waveguide, by means of which the at least one part of the coupled-in thermal radiation is guided to the temperature measuring unit, is connected to the laser generator in such a way that the laser beam used to heat the bonding tool is guided by the waveguide from the laser generator to the bonding tool. The waveguide is advantageously given a dual function hereby. It is used, on the one hand, to guide the laser beam to the bonding tool and, on the other hand, to guide the thermal radiation to the temperature measuring unit. On the whole, this makes it possible to provide the device according to the invention for heating and determining the actual temperature of the bonding tool with a very compact design and to implement it cost-effectively. It is also possible to install the laser generator in a fixed location outside the bonding head and to guide the laser beam to the bonding tool via the waveguide with the result that the moving masses are small.

For example, a beam splitter can be assigned to the waveguide for the purpose of, on the one hand, guiding the laser beam from the laser generator to the bonding tool and, on the other hand, guiding the thermal radiation guided in the opposite direction from the laser beam in the waveguide to the temperature measuring unit.

Different wavelengths are advantageously selected for the laser beam and the thermal radiation. For example, a laser beam having a wavelength in the range from 900 nm to 1200 nm is used to heat the bonding tool, while the temperature measuring unit is designed for thermal radiation in a wavelength range of, for example, 1500 nm to 2500 nm.

The laser beam can be oriented relative to the bonding tool in such a way that the laser beam strikes the bonding tool in the recess. In particular, the recess may be implemented in the manner of a radiation trap. A surface geometry of the lateral surface of the bonding tool in the region of the recess is formed in such a way that a part of the laser beam not absorbed by the bonding tool is completely or at least predominantly reflected again in the direction of the lateral surface of the bonding tool. The heating of the top of the bonding tool is advantageously favored hereby. Moreover, the risk of the laser light being scattered in an undirected manner is reduced.

A beam-forming optical system and preferably at least one lens can be arranged in the beam path of the thermal radiation and/or the laser beam between the head end of the waveguide and the recess formed on the bonding tool. For example, the lens is designed as a collimator lens. The collimator lens ensures that the laser beam, which is usually coupled out of the waveguide in a divergent manner, has an at least approximately parallel beam path after passing through the optical system. By parallelizing the beam path, a partial surface of the lateral surface of the bonding tool is advantageously heated relatively uniformly, and it is possible to reliably avoid the divergent laser beam emerging from the waveguide from striking the bonding tool at least partially outside the recess or being guided past the bonding tool and possibly striking the joining element or the substrate. The temperature measurement may also be corrupted.

The beam-forming optical system may be designed as a focusing optical system for bundling the laser beam coupled out of the waveguide. For example, a focal point of the focusing optical system may be provided in the recess of the bonding tool and preferably be located in front of or behind the lateral surface of the bonding tool, i.e., in the interior of the bonding tool. A locally highly delimited partial surface of the bonding tool may be advantageously greatly heated by providing the focusing optical system. It is thus possible to depict great temperature gradients over time when heating the bonding tool and to implement good dynamics.

Two or more optical elements, which preferably comprise a collimator lens and a focusing lens, may form the beam-forming optical system. For example, the beam-forming optical system may provide one collimator lens and one focusing lens. The laser beam emerging from the optical waveguide in a divergent manner first strikes the collimator lens and has an essentially parallel beam path after passing through the collimator lens. The laser beam having the essentially parallel beam path then strikes the focusing lens and is focused.

The recess on the bonding tool can be designed as a through-recess. The through-recess is comparatively easy and cost effective to manufacture. In addition, it is possible to manufacture the through-recess with a high geometric accuracy.

The recess on the bonding tool can be implemented in the form of a pocket. Within the meaning of the invention, a recess has a pocket shape when it is implemented as a local indentation with a closed back side, so that the laser beam is unable to pass through the recess or would be reflected at a recess base. The absorption capacity of the bonding tool is advantageously improved by providing the pocket-shaped recess. Moreover, an uncontrolled reflection of the laser beam is counteracted.

The bonding tool can taper in a wedge-shaped manner in the direction of the first end face, and the recess is provided, at least in sections, in the region of the tip of the bonding tool defined by the wedge-shaped tapering of the lateral surface. By providing the recess in the region of the tip of the bonding tool, a heating of the same may advantageously take place locally where the joining element is placed against the bonding tool. Good thermal dynamics also result, since little material needs to be heated in the region of the tool tip, due to the tapering lateral surface and the material gap in the region of the recess.

Further scope of applicability of the present invention will become apparent from the detailed description given hereinafter. However, it should be understood that the detailed description and specific examples, while indicating preferred embodiments of the invention, are given by way of illustration only, since various changes, combinations, and modifications within the spirit and scope of the invention will become apparent to those skilled in the art from this detailed description.

BRIEF DESCRIPTION OF THE DRAWINGS

The present invention will become more fully understood from the detailed description given hereinbelow and the accompanying drawings which are given by way of illustration only, and thus, are not limitive of the present invention, and wherein.

DETAILED DESCRIPTION

The device according to the invention for heating and determining an actual temperature of a bonding tool of an ultrasonic bonder is used, for example, in laser-supported ultrasonic thick wire bonding, in laser-supported ultrasonic thin wire bonding, in laser-supported ultrasonic welding, in laser-supported ribbon bonding or in laser-supported chip bonding. The following description of exemplary embodiments of the invention is limited to the illustration and discussion of tools for ultrasonic wire bonding. However, the device according to the invention may also be used for other tools or ultrasonic bonders.

Figure 1:
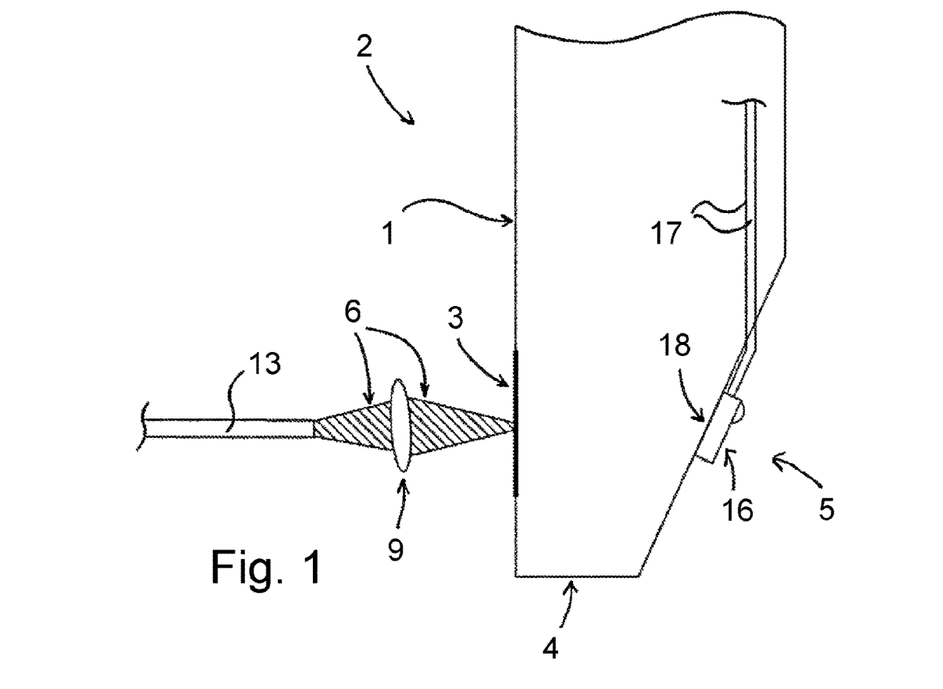
FIG. 1 shows a schematic representation of a first specific embodiment of a device according to the invention for heating and determining an actual temperature of a bonding tool in a partial view.

FIG. 1 shows an example of the device according to the invention, which provides an absorption region 3 on a lateral surface 1 of a bonding tool 2. Lateral surface 1 of bonding tool 2 connects a first end face 4 of bonding tool 3 to a second end face, which is situated opposite first end face 4. A joining element, for example an aluminum or copper wire, is placed against bonding tool 2 in the region of first end face 4. Bonding tool 2 is usually fixed to a receptacle on the bonding head in the region of the second end face.

To establish an electrically conductive connection between the joining element and a substrate or a function element with first end face 4, bonding tool 2 is pressed against the joining element and a contact surface of the substrate or function element in such a way that the joining element is clamped between the contact surface and first end face 4 of bonding tool 2. Bonding tool 2 is then excited to ultrasonic vibrations, in particular to ultrasonic bending vibrations, via an ultrasonic generator. As a result of the ultrasonic vibrations of bonding tool 2, the joining element is moved relative to the contact surface, and an electrically conductive, integral connection is formed between the joining element and the contact surface during contact.

To have additional energy available during the establishment of the electrically conductive connection, a tip 5 of bonding tool 2 having first end face 4 is heated with the aid of a laser beam 6 during the laser-supported ultrasonic bonding. Laser beam 6 is provided by a laser generator of the device according to the invention and guided to bonding tool 2 via a waveguide 13. A free head end of waveguide 13 facing bonding tool 2 is oriented toward absorption region 3 of bonding tool 2 in such a way that laser beam 6 strikes lateral surface 1 of bonding tool 2 in absorption region 3. A lens is provided as a beam-forming optical system 9 between the free end of waveguide 13 and bonding tool 2. Optical system 9 focuses laser beam 6 emanating from waveguide 13 in a divergent manner.

A temperature sensor 16 of a temperature measuring unit is provided opposite absorption region 3 on bonding tool 2. It may be provided, in particular, that temperature sensor 16 is a thermocouple or a resistance thermometer. Temperature sensor 16 defines a temperature measuring point 18 on bonding tool 2. It is glued, in particular, onto lateral surface 1 of bonding tool 2. Alternatively, temperature sensor 16 may be fixed on bonding tool 2 in a force-fitting and/or form-fitting manner. For example, the fixing may then take place temporarily, for example for calibration purposes.

Temperature sensor 16 is contacted via two supply leads 17. Energy for operating sensor 16 and/or data, in particular temperature measurement data, is/are transmitted via supply leads 17. Supply leads 17 are run along bonding tool 2, so that a working range of the bonder is not impaired. It may be provided, in particular, that supply leads 17 are run to a separate evaluation unit of the temperature measuring unit or to the bonder electronics.

Figure 2:
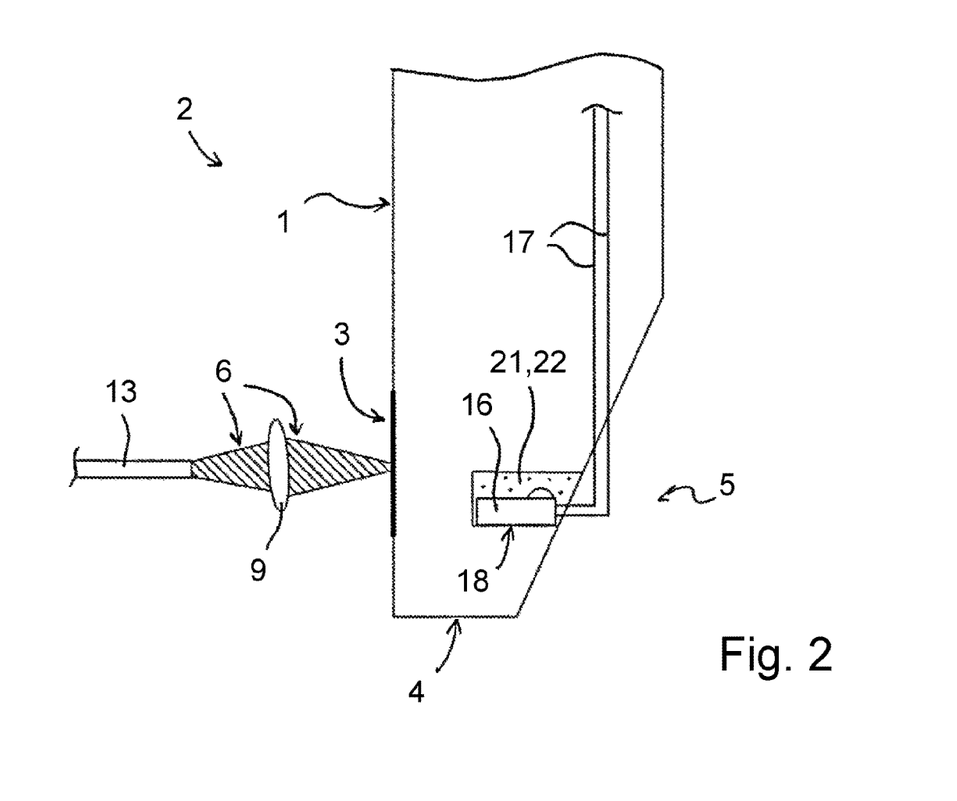
FIG. 2 shows a schematic representation of a second specific embodiment of the device according to the invention for heating and determining the actual temperature of a bonding tool in a partial view.

According to a second specific embodiment of the invention according to FIG. 2, it is provided to provide temperature sensor 16 in a sensor recess 21 formed at bonding tool tip 5. Sensor 16 is enveloped with a casting material 22 and cast in sensor recess 21. For example sensor recess 21 is a bore. Temperature measuring point 18 is situated at the location of sensor 16 in sensor recess 21.

Temperature sensor 16 is contacted as before via supply leads 17. Supply leads 17 are run upwardly along bonding tool 2 and to the evaluation electronics of the temperature measuring unit or the bonder electronics.

With regard to the heating of bonding tool 2 with the aid of laser beam 6, the second exemplary embodiment of the invention corresponds to the first exemplary embodiment.

Figure 3:
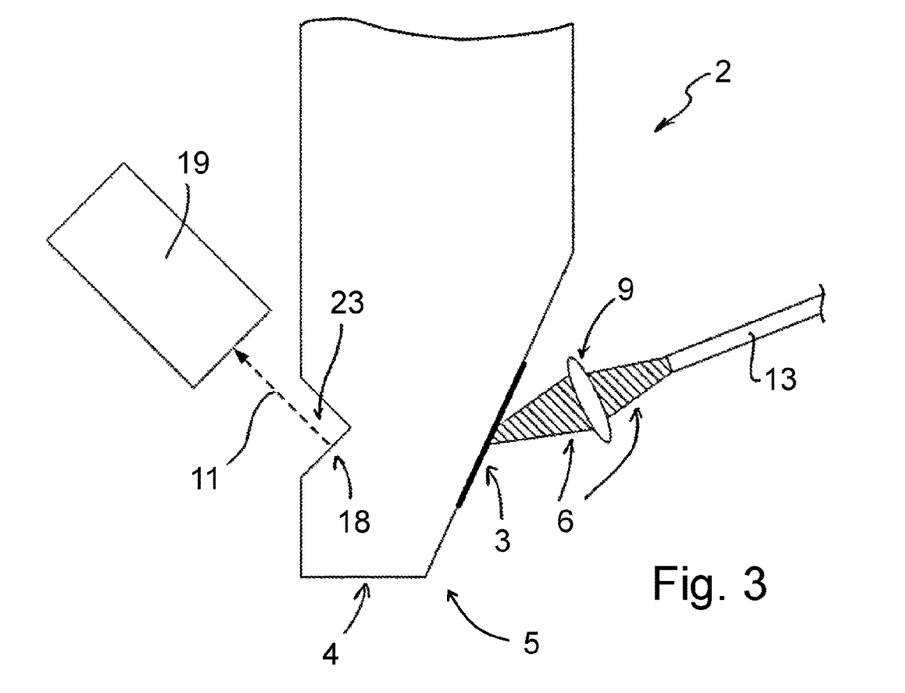
FIG. 3 shows a schematic representation of a third specific embodiment of the device according to the invention for heating and determining the actual temperature of a bonding tool in a partial view.

According to a third specific embodiment of the invention illustrated in FIG. 3, absorption region 3 is provided toward the back in the region of tip 5 of bonding tool 2. Bonding tool 2 is otherwise heated with the aid of laser beam 6 in the manner explained above. In particular, laser beam 6 is guided to bonding tool 2 via waveguide 13 and optical system 9.

According to the third exemplary embodiment, the measurement of the actual temperature of bonding tool 2 is contactless. A radiation thermometer or pyrometer 19 aimed at tip 5 of the bonding tool is used for the contactless temperature measurement. For example, temperature measuring point 18 provided in a measurement recess 23, which is provided on the lateral surface of the bonding tool 2.

Figure 4:
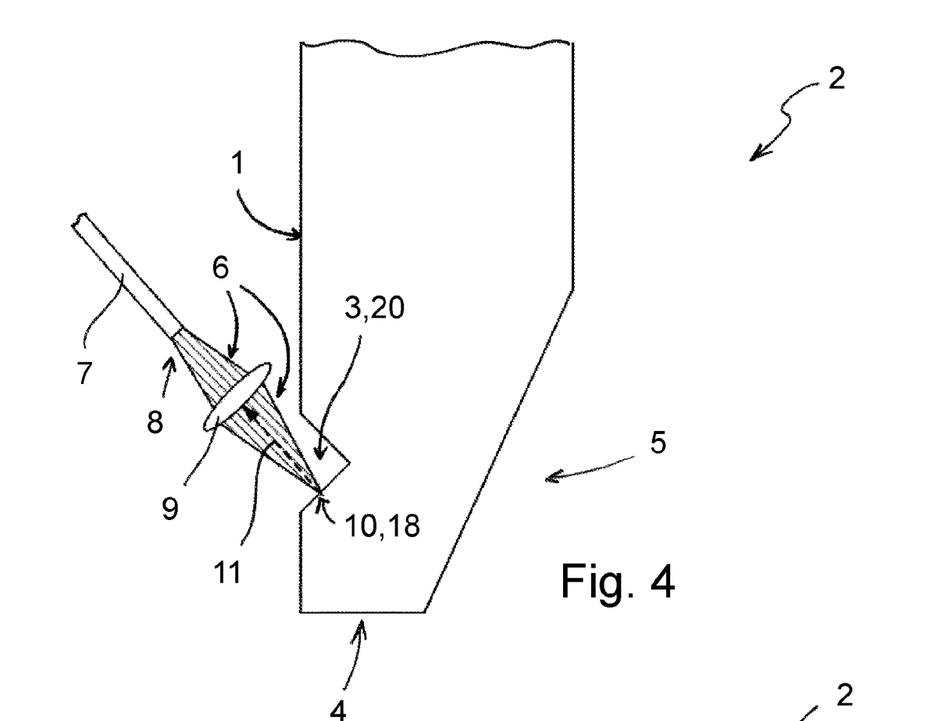
FIG. 4 shows a schematic representation of a fourth specific embodiment of a device according to the invention for heating and determining an actual temperature of a bonding tool in a partial view.

According to a fourth specific embodiment of the invention according to FIG. 4, it is provided that a recess 20 is provided on lateral surface 1 of bonding tool 2. Recess 20 defines absorption region 3 of bonding tool 2. Temperature measuring point 18 is also situated in absorption region 3 or in the region of recess 20 on lateral surface 1 of bonding tool 2.

As before, an electrically conductive, integral connection is established between the joining element, on the one hand, and the function element or the substrate, on the other hand, while the joining element, including bonding tool 2, is pressed against the contact surface of the function element or the substrate, and the bonding tool is excited to ultrasonic vibrations, and bonding tool 2 is additionally heated via laser beam 6.

Laser beam 6 is guided to bonding tool 2 via a waveguide 7. When laser beam 6 emerges from waveguide 7, laser beam 6 has a divergent beam path. Beam-shaping optical system 9 is provided between free head end 8 of waveguide 7 and recess 20 of bonding tool 2. In the present case, beam-shaping optical system 9 is designed as a focusing optical system or lens for bundling laser beam 6 emerging from waveguide 7. The optical properties of focusing optical system 9 as well as its assignment to bonding tool 2 is selected in such a way that a focal point 10 of the optical system is situated in the region of recess 20 and preferably in front of or behind lateral surface 1 of bonding tool 2.

Tip 5 of bonding tool 2 is heated by laser beam 6. A part of thermal radiation 11 emitted by the tool as a result of the heating passes through optical system 9, strikes head end 8 of waveguide 7 and is coupled into waveguide 7. To determine an actual temperature of tip 5 of bonding tool 2 concurrently with the process, the part of thermal radiation 11 coupled into waveguide 7 is supplied to a temperature measuring unit for the purpose of determining the actual temperature of bonding tool 2.

In the present exemplary embodiment of the invention, waveguide 7 is used, on the one hand, to guide laser beam 6, which is provided by the laser generator, to bonding tool 2. On the other hand, waveguide 7 is used to conduct the part of thermal radiation 11 coupled into waveguide 7 to the temperature measuring unit.

Head end 8 of waveguide 7 is provided at a distance from lateral surface 1 of bonding tool 2. A distance is selected in such a way that a contamination of waveguide 7 by particles, which may detach, in particular, from the joining element during bonding, is counteracted. Moreover, situating waveguide 7 at a distance from bonding tool 2 ensures that the ultrasonic vibrations are not transferred to waveguide 7.

Figure 5:
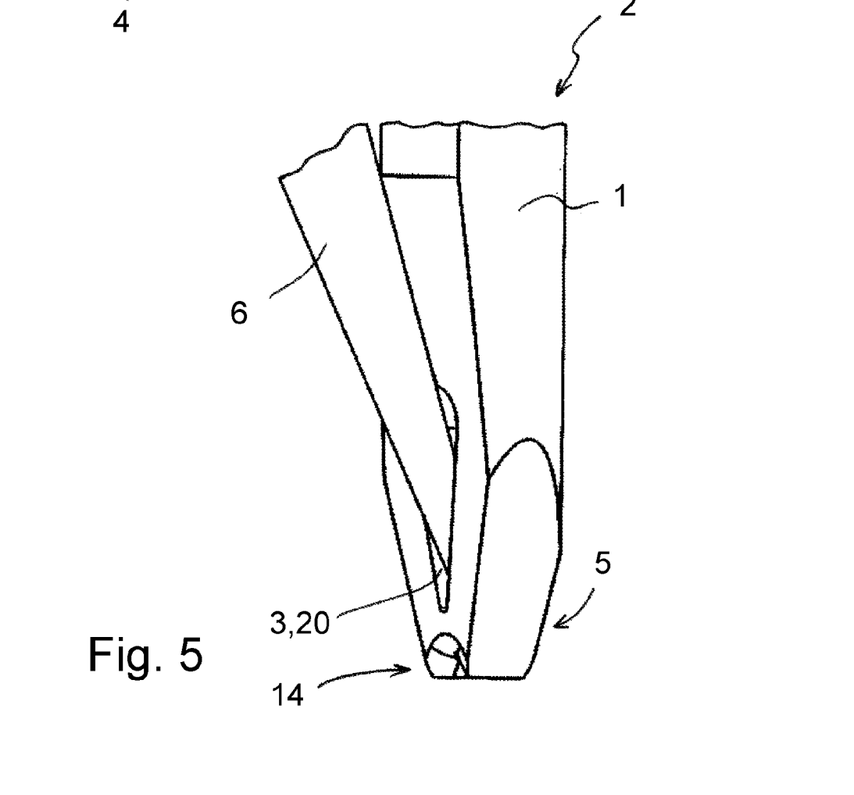
FIG. 5 shows a perspective view of a tip of the bonding tool, with a laser beam striking the bonding tool.
Figures 6, 8, 9:
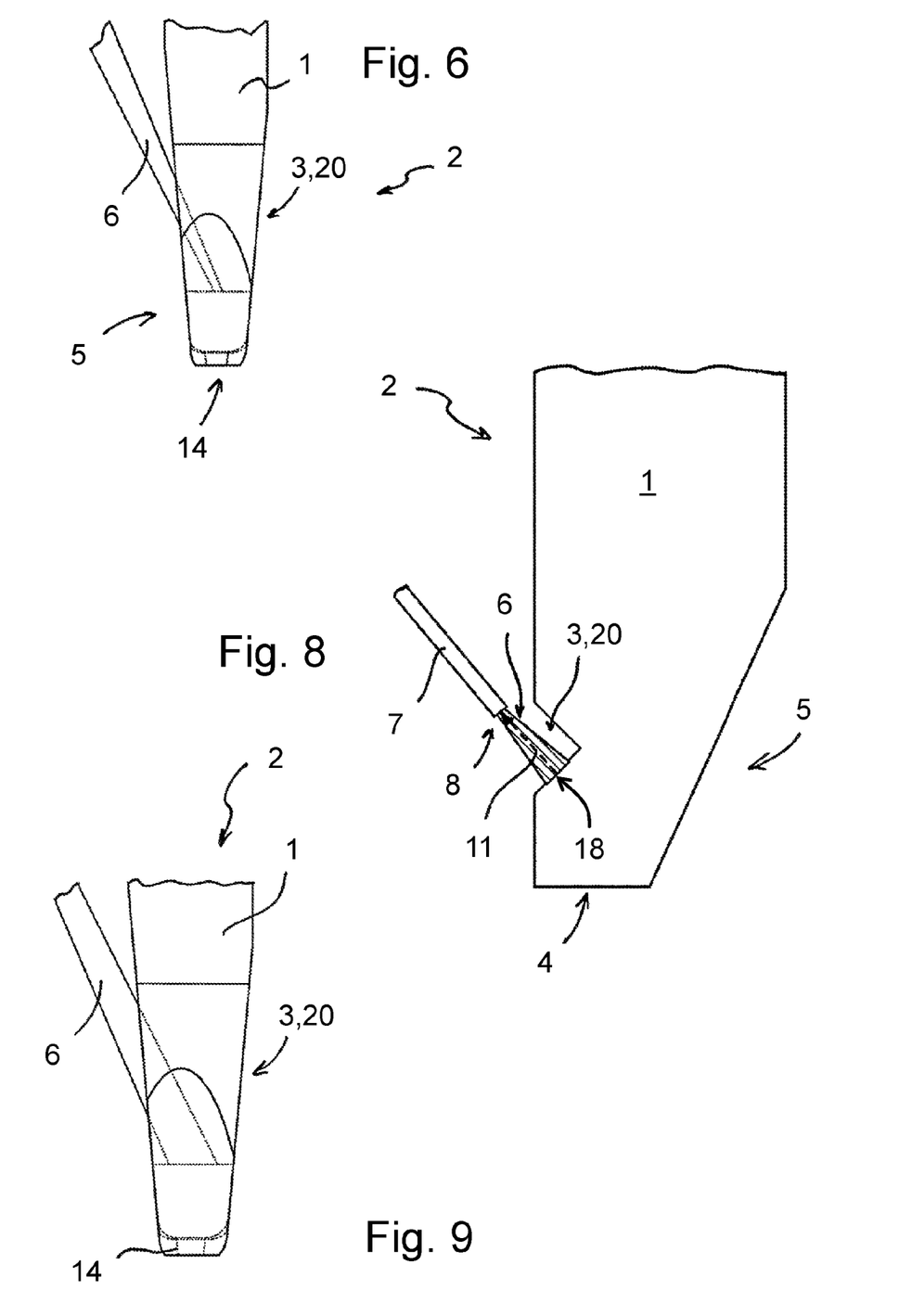
FIG. 6 shows a side view of the tip of the bonding tool and the laser beam according to FIG. 5.
FIG. 8 shows a schematic representation of a sixth specific embodiment of the device according to the invention for heating and determining the actual temperature of a bonding tool in a partial view.
FIG. 9 shows the tip of the bonding tool of the device according to the invention, with a divergent laser beam aimed at the tip.

FIGS. 5 and 6 show tip 5 of bonding tool 2 perspectively and in a side view, including recess 20. Recess 20 defines absorption region 3. In the present case, it is designed in the manner of a through-recess. Laser beam 6 focused via optical system 9 strikes lateral surface 1 of the bonding tool in the region of recess 20 and heats bonding tool 2. A part of laser radiation 6 not absorbed by bonding tool 2 upon the first striking of laser beam 6 is reflected in the region of recess 20, due to the surface geometry of lateral surface 1 of the bonding tool, in such a way that it also predominantly restrikes lateral surface 1 of bonding tool 2 and contributes to the heating of bonding tool 2.

Figure 7:
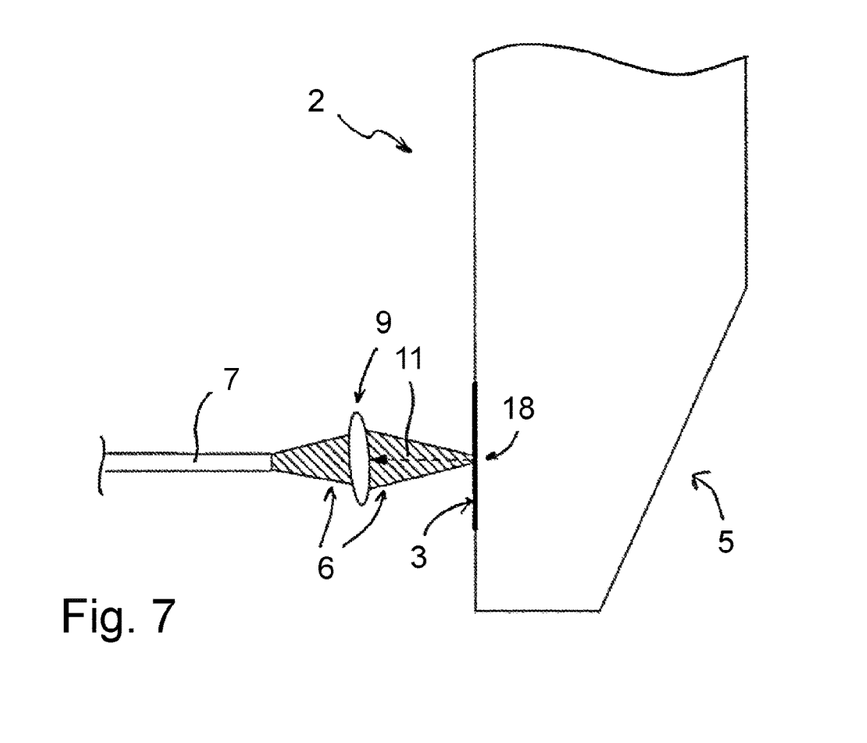
FIG. 7 shows a schematic representation of a fifth specific embodiment of the device according to the invention for heating and determining the actual temperature of a bonding tool in a partial view.

According to a fifth specific embodiment of the invention illustrated in FIG. 7, bonding tool 2 is heated with the aid of laser beam 6 and the temperature is measured with the aid of bonding tool 2 as a result of thermal radiation 11 emitted as a result of the heating in a similar way as in the fourth exemplary embodiment. However, the formation of a recess 20 defining absorption region 3 at tip 5 of bonding tool 2 is dispensed with. Instead, absorption region 3 is provided over a wide area of the lateral surface of the bonding tool. Temperature measuring point 18 is situated in absorption region 3.

According to a sixth specific embodiment of the device according to the invention according to FIG. 8, a beam-forming optical system 9 arranged with between free head end 8 of waveguide 7 and recess 20 of bonding tool 2 defining absorption region 3 and temperature measuring point 18 is dispensed with. Laser beam 6 emerging from waveguide 7 in a divergent manner strikes lateral surface 1 of bonding tool 2 directly in the region of recess 20 and heats the latter also in the region of tip 5. Likewise, a part of thermal radiation 11 emitted by bonding tool 2 as a result of the heating thereof directly strikes free head end 8 of waveguide 7 and is coupled thereinto. The coupled-in part of thermal radiation 11 then reaches the temperature measuring unit of the device according to the invention as described for the above exemplary embodiment.

FIG. 9 shows how divergent laser beam 6 strikes tip 5 of the bonding tool in the region of recess 20.

Figure 10:
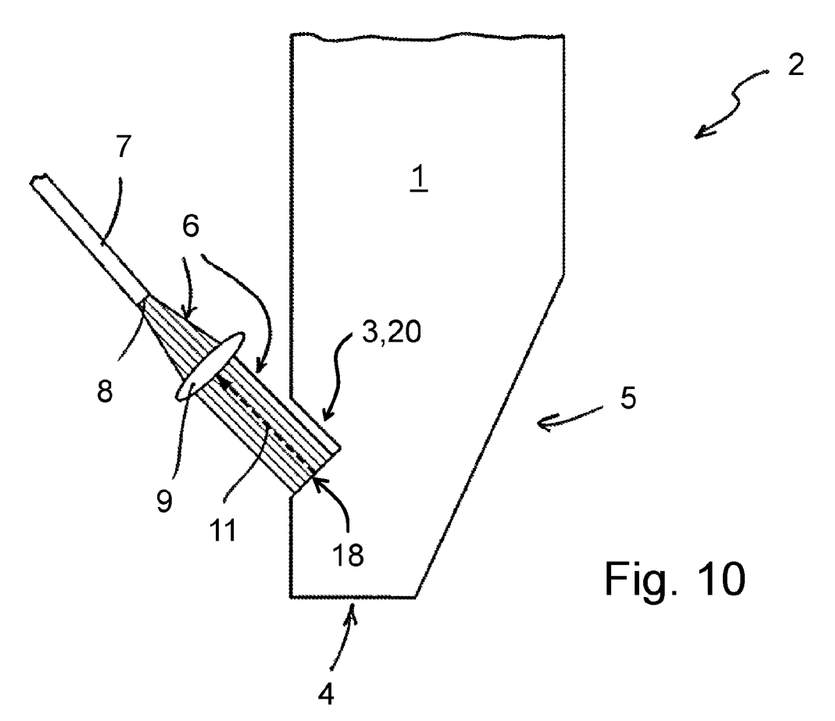
FIG. 10 shows a schematic representation of a seventh specific embodiment of the device according to the invention for heating and determining the actual temperature of a bonding tool in a partial view.
Figure 11:
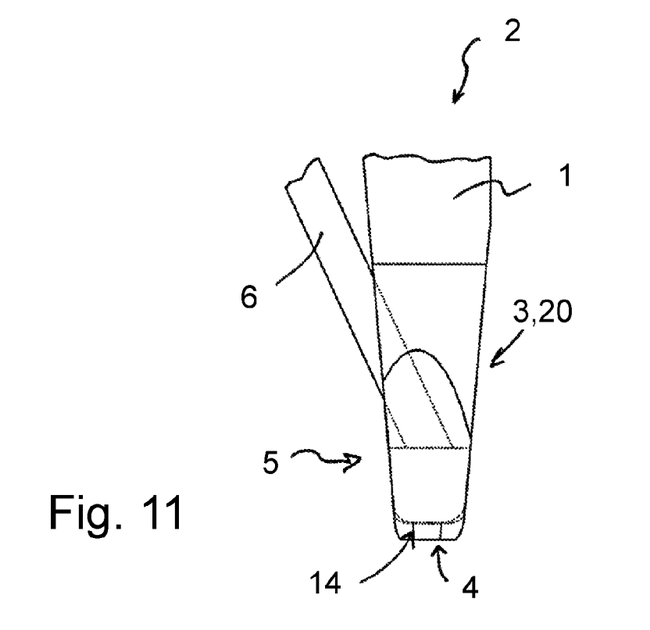
FIG. 11 shows a side view of the tip of the bonding tool and a laser beam having a parallel beam path aimed at the tip of the bonding tool.

According to a seventh specific embodiment of the invention according to FIGS. 10 and 11, beam-forming optical system 9 is implemented as a collimator lens 9. Laser beam 6 emerging from waveguide 7 in a divergent manner strikes collimator lens 9. Collimator lens 9 ensures an at least essentially parallel beam path of laser beam 6.

Figure 12:
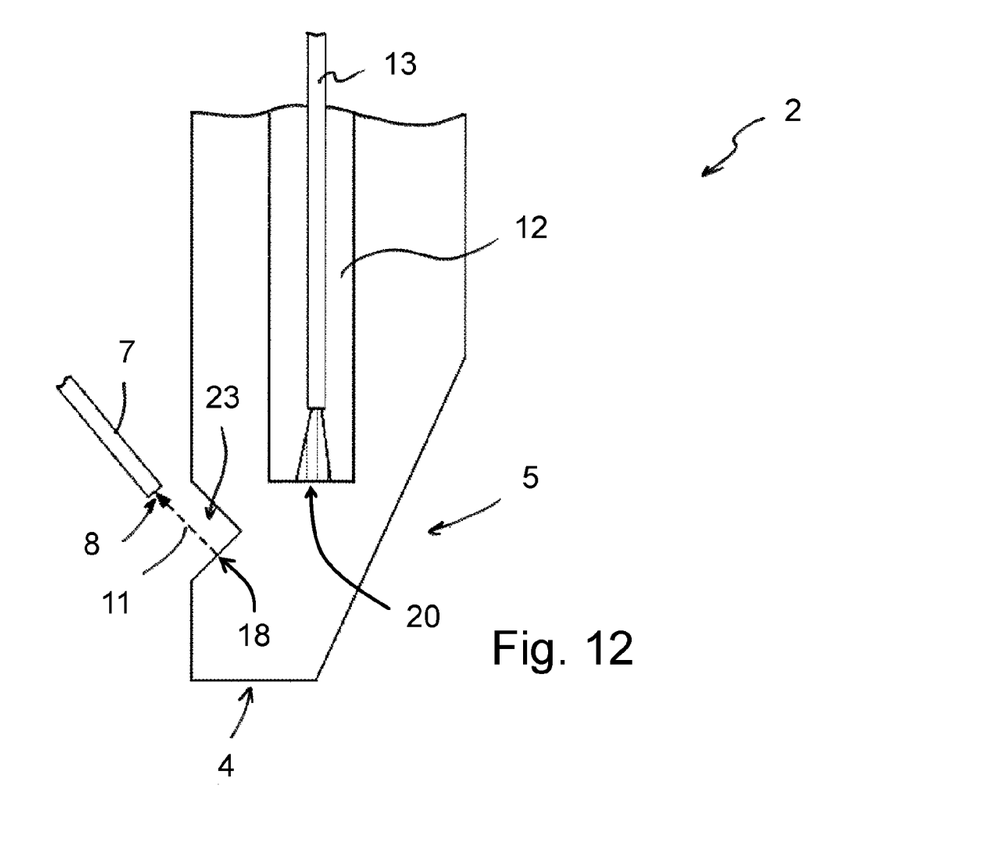
FIG. 12 shows a schematic representation of an eighth specific embodiment of the device according to the invention for heating and determining the actual temperature of a bonding tool in a partial sectional view.

According to an eighth specific embodiment of the invention according to FIG. 12, it is provided that waveguide 7 of the device according to the invention for heating and determining an actual temperature of bonding tool 2 is used solely to guide the part of thermal radiation 11 emitted in the direction of free head end 8 of waveguide 7 to the temperature measuring unit. As illustrated, optical system 9 may be dispensed with. Alternatively, thermal radiation 11 may be coupled into waveguide 7 via a suitable optical element.

To heat bonding tool 2 in the region of tip 5, a longitudinal recess 12 run from the second end face to tip 5 is provided on bonding tool 2. A further waveguide 13 is positioned in longitudinal recess 12. Waveguide 13 is used to guide laser beam 6 provided by the laser generator to tip 5 of bonding tool 2.

Figure 13:
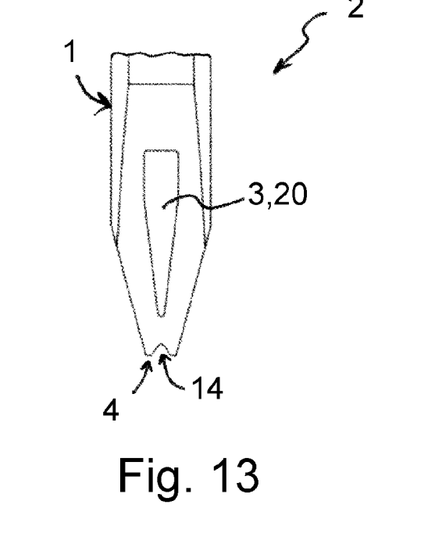
FIG. 13 shows a tip of the bonding tool, including a recess in a first geometric shape.
Figure 14:
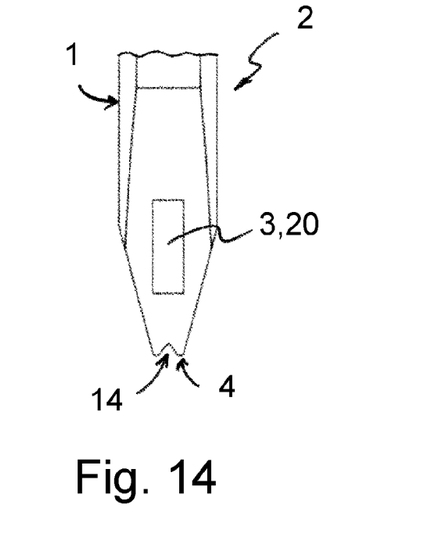
FIG. 14 shows the front view of the bonding tool, including the recess in a second geometric shape.

Examples of two recesses 20 having different geometries are illustrated in FIGS. 13 and 14. In FIG. 13, recess 20 has a cross-section tapering in the direction of first end face 4 of bonding tool 2 in the illustrated front view. The geometry of recess 20 approximately corresponds to a wedge shape of tip 5 of bonding tool 2.

In FIG. 14, recess 20 has a constant cross-section. In the front view, recess 20 has an approximately rectangular shape.

In each case—as is apparent in FIGS. 13 and 14—a wedge-shaped receiving groove 14 is provided on first end face 4 of bonding tool 2. Wedge-shaped receiving groove 14 is used to receive or center the bonding wire used as the joining element.

Figure 15:
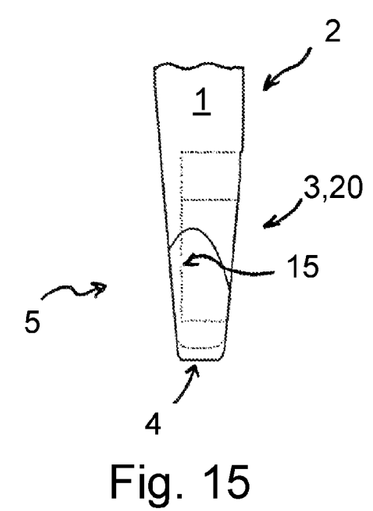
FIG. 15 shows a side view of the tip of the bonding tool, including a pocket-shaped recess.
Figure 16:
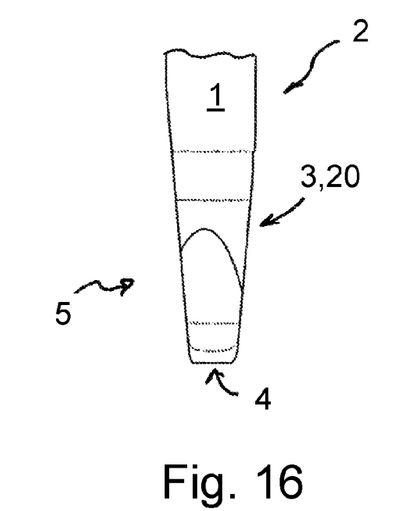
FIG. 16 shows the tip of the bonding tool, including a recess implemented as a through-recess.

In FIGS. 15 and 16, bonding tool 2 or tip 5 of bonding tool 2 is illustrated in a side view. In the exemplary embodiment according to FIG. 15, recess 20 is provided with a pocket-shaped design. Recess 20 does not pass all the way through and is limited by a recess base 15. Conversely, recess 20 in the exemplary embodiment according to FIG. 16 is implemented in the manner of a through-recess.

The invention being thus described, it will be obvious that the same may be varied in many ways. Such variations are not to be regarded as a departure from the spirit and scope of the invention, and all such modifications as would be obvious to one skilled in the art are to be included within the scope of the following claims.

What is claimed is:

1. A device for heating and determining an actual temperature of a bonding tool of an ultrasonic bonder, the device comprising:
    a first end face and a second end face formed on the bonding tool;
    a lateral surface of the bonding tool connecting the first end face to the second end face;
    an absorption region provided on the lateral service of the bonding tool;
    a temperature measuring unit for determining an actual temperature of the bonding tool at a temperature measuring point, which is provided on the lateral surface of the bonding tool or at a tip of the bonding tool; and
    a laser generator to form a laser beam, the laser beam striking the bonding tool in the absorption region, and the bonding tool being heated as a result of the absorption of the laser beam,
    wherein the temperature measuring point is provided in the absorption region,
    wherein a waveguide is provided, which has a free head end aimed at the temperature measuring point, the head end of the waveguide being assigned to the temperature measuring point at a distance, such that at least one part of a thermal radiation emitted by the bonding tool as a result of the heating of the bonding tool by the laser beam strikes the head end of the waveguide and is coupled into the waveguide, the temperature measuring unit interacting with the waveguide such that at least one part of the thermal radiation coupled into the waveguide is conducted to the temperature measuring unit,
    wherein the waveguide is assigned to the laser generator such that the laser beam used to heat the bonding tool is guided to the bonding tool by the waveguide, and
    wherein a beam-forming optical system having a lens is arranged in the beam path of the thermal radiation and/or the laser beam between the head end of the waveguide and the absorption region formed on the bonding tool.

2. The device according to claim 1, wherein the bonding tool has a better absorption capacity in the absorption region than outside the absorption region.

3. The device according to claim 1, wherein the temperature measuring unit is configured to measure temperature contactlessly.

4. The device according to claim 1, wherein the absorption region is formed by a recess provided on the lateral surface of the bonding tool.

5. The device according to claim 4, wherein the recess is designed as a radiation trap for the laser beam, in that a surface geometry of the lateral surface of the bonding tool in the region of the recess is formed such that a part of the laser beam not absorbed by the bonding tool and striking the bonding tool for the first time is predominantly reflected in the direction of the lateral surface of the bonding tool.

6. The device according to claim 4, wherein the beam-forming optical system is implemented as a collimator lens in such a way that the laser beam coupled out of the waveguide has an approximately parallel beam path after passing through the collimator lens, or that the beam-forming optical system is designed as a focusing optical system for bundling the laser beam coupled out of the waveguide and/or the thermal radiation coupled into the waveguide.

7. The device according to claim 6, wherein a focal point of the focusing optical system is provided in the recess of the bonding tool and is situated in front of the lateral surface of the bonding tool.

8. The device according to claim 1, wherein the beam-forming optical system is designed as a divergence optical system for widening the beam path of the laser beam.

9. The device according to claim 4, wherein the recess is designed as a through-recess.

10. The device according to claim 4, wherein the recess is provided with a pocket-shaped design.

11. The device according to claim 4, wherein the bonding tool tapers in a wedge-shaped manner in the direction of the first end face and/or the recess is provided, at least in sections, in the region of a tip of the bonding tool formed by the wedge-shaped tapering.

12. A device for heating and determining an actual temperature of a bonding tool of an ultrasonic bonder, the device comprising:
    a first end face and a second end face formed on the bonding tool;
    a lateral surface of the bonding tool connecting the first end face to the second end face;
    an absorption region provided on the lateral service of the bonding;
    a temperature measuring unit for determining an actual temperature of the bonding tool at a temperature measuring point, which is provided on the lateral surface of the bonding tool or at a tip of the bonding tool; and
    a laser generator to form a laser beam, the laser beam striking the bonding tool in the absorption region, and the bonding tool being heated as a result of the absorption of the laser beam,
        wherein the laser generator comprises a waveguide, the waveguide having a free head end aimed at the temperature measuring point, the head end of the waveguide being configured to the temperature measuring point at a distance, such that at least one part of a thermal radiation emitted by the bonding tool as a result of the heating of the bonding tool by the laser beam strikes the head end of the waveguide and is coupled into the waveguide, the temperature measuring unit interacting with the waveguide such that at least one part of the thermal radiation coupled into the waveguide is conducted to the temperature measuring unit, wherein the waveguide is assigned to the laser generator such that the laser beam used to heat the bonding tool is guided to the bonding tool by the waveguide, wherein a beam-forming optical system and a lens are arranged in the beam path of the thermal radiation and/or the laser beam between the head end of the waveguide and the absorption region formed on the bonding tool, wherein the beam-forming optical system is implemented as a collimator lens in such a way that the laser beam coupled out of the waveguide has an approximately parallel beam path after passing through the collimator lens, or that the beam-forming optical system is designed as a focusing optical system for bundling the laser beam coupled out of the waveguide and/or the thermal radiation coupled into the waveguide, and wherein a focal point of the focusing optical system is provided in the absorption region of the bonding tool and is situated in front of the lateral surface of the bonding tool.

* * * * *